United States Patent
Ding et al.

(10) Patent No.: US 10,173,249 B2
(45) Date of Patent: Jan. 8, 2019

(54) CALIBRATION OF SEMICONDUCTOR METROLOGY SYSTEMS

(71) Applicant: Rudolph Technologies, Inc., Flanders, NJ (US)

(72) Inventors: Jian Ding, Hackettstown, NJ (US); Priya Mukundhan, Lake Hopatcong, NJ (US); James Kane, Sparta, NJ (US); Steven Peterson, Blairstown, NJ (US); Fei Shen, Budd Lake, NJ (US)

(73) Assignee: Rudolph Technologies, Inc., Wilmington, MA (US)

( * ) Notice: Subject to any disclaimer, the term of this patent is extended or adjusted under 35 U.S.C. 154(b) by 383 days.

(21) Appl. No.: 14/881,847

(22) Filed: Oct. 13, 2015

(65) Prior Publication Data

US 2016/0101445 A1 Apr. 14, 2016

Related U.S. Application Data

(60) Provisional application No. 62/063,232, filed on Oct. 13, 2014.

(51) Int. Cl.
*B08B 7/00* (2006.01)
*B08B 7/04* (2006.01)
*H01L 21/02* (2006.01)
*G01D 18/00* (2006.01)
*H01L 21/67* (2006.01)

(52) U.S. Cl.
CPC .......... *B08B 7/0057* (2013.01); *G01D 18/00* (2013.01); *H01L 21/02046* (2013.01); *H01L 21/67028* (2013.01); *H01L 21/67115* (2013.01); *H01L 21/67288* (2013.01)

(58) Field of Classification Search
CPC ......... H01L 21/67028; H01L 21/67115; H01L 21/67288; H01L 21/02046; G01D 18/00; B08B 7/0057
See application file for complete search history.

(56) References Cited

U.S. PATENT DOCUMENTS

2011/0089346 A1* 4/2011 Tsuruta ................. B82Y 10/00
250/492.22

* cited by examiner

*Primary Examiner* — Alexander Markoff

(57) ABSTRACT

A method of cleaning calibration and other substrates that improves the correlation of measurements from calibration and product substrates and increases the useful life of the calibration substrates is herein disclosed. By exposing a calibration substrate to ultraviolet light, a reaction is triggered that results in the cleaning of the contaminants from the calibration substrate. For instance, monatomic oxygen is introduced to contaminants on the surface of a calibration substrate to remove the contaminants without inducing modifications in the substrate itself. Through the cleaning process, the temperature of the calibration substrate may be controlled to limit adverse effects caused by the overheating of the calibration substrate.

11 Claims, 5 Drawing Sheets

CALIBRATION OF SEMICONDUCTOR METROLOGY SYSTEMS

CROSS-REFERENCE TO RELATED APPLICATIONS

This application claims priority to U.S. Provisional Application No. 62/063,232, filed Oct. 13, 2014, the entirety of which is incorporated herein by reference.

INTRODUCTION

In the ongoing struggle to keep up with the torrid pace set for integrated circuit (IC) manufacturers by Moore's Law, it is necessary to ensure that quality and process control tools and systems are able to keep up with the increasingly more complex and capable IC processing tools used for deposition, lithography, developing, and the like. One way that process control engineers ensure that their process tools are operating properly is to measure their semiconductor product substrates on which IC devices are formed. And, to ensure that the metrology systems used to measure process tool performance is up to acceptable standards, it is useful to continually monitor the operation of those metrology systems.

Rather than using product wafers to verify calibration of metrology systems, it is the practice of semiconductor manufacturers to use calibration substrates that have some or all of the features of the product substrates that are being measured. While many different types of substrates, structures, layers, materials, and processes are monitored, for the purposes of this description, the metrology of thin film gate oxides, a structure familiar to those skilled in the art, will be used as an example for this discussion. A calibration substrate for monitoring the functionality of metrology systems, e.g. ellipsometers, used in turn to monitor the process tools may include a silicon wafer on which a uniform layer of a gate oxide is deposited. Metrology systems continually measure one or more calibration substrates to ensure that each metrology system remains both accurate and precise in its operation. It is common practice to utilize a single calibration wafer with multiple metrology systems, thereby ensuring that the respective systems all match one another to within a predetermined specification.

Over time, hydrocarbon contamination or other types of contamination may be deposited on the surface of a calibration substrate. The contamination may be caused by nearby machines, ventilation systems, vapor emitting materials, or even from the exhalations of operators that manage the facility. Such types of contamination are fairly endemic in the semiconductor fabrication field and can make it difficult to determine whether anomalous measurements are due to drift in the settings of a metrology tool or due to increased contamination. Accordingly, it is a common practice to clean calibration substrates to reduce variation in the structures formed on a calibration wafer.

Cleaning of calibration substrates, however, can have negative effects on the properties of a calibration substrate. Most cleaning systems in everyday use have the counterintuitive effect of modifying the calibration substrates, the very thing that is to be avoided. For example, solvent based cleaning systems may leave a residue on the surface of a calibration substrate. Thermal-type cleaning systems using infrared, microwave or other high energy cleaning techniques to heat a substrate to desorb hydrocarbon contamination may actually promote the growth of gate oxide layers on a calibration substrate due to increased diffusion of oxygen through the existing gate oxide layer to the surface of the calibration wafer.

Metrology systems of many types, such as ellipsometers, use lasers and other optical sources to measure characteristics of substrates, both product and calibration. The energy of these optical sources can itself cause variation in a substrate where the heat imparted to the substrate by the metrology tool induces an advanced rate of oxide growth in the test site. Such growth may be particularly evident in those sites on a calibration substrate that are measured repeatedly using high energy illumination. Similarly, some manufacturers prepare a calibration substrate 10 for measurement using high intensity lasers to locally ablate contaminations at the site of a planned measurement. Repeated use of such ablation systems can create local variation in the calibration substrates that necessitate repeated measurements and premature replacement of the calibration substrate.

SUMMARY

The present technology relates to a system for treatment of calibration substrates. The system involves identifying a discrepant datum or trend in measurement data obtained by a measuring tool. A calibration check or measurement is then conducted. Before the calibration proceeds, however, it is helpful to first clean the calibration substrate. Cleaning includes directing ultraviolet (UV) light at a wavelength of between approximately 185 nm and 254 nm to the surface of the calibration substrate at a power sufficient to remove substantially all molecular airborne contaminants from the surface of the calibration substrate. The goal, generally, is to clean the substrate without raising its temperature above approximately 50° C. Once clean, the calibration substrate is measured to determine whether the discrepant datum or trend in the measurement data was due to an anomaly in the measuring tool. It is also possible, however, that the discrepant datum or trend may be derived from the measurement of calibration substrates or product substrates.

Because it is important to ensure that there is a proper correlation between measurements taken from a calibration substrate and those from a product substrate, it is desirable to record at least one measurement of the calibration substrate taken on a plurality of measuring tools over a predetermined period of time. Similarly, measurements of product substrates taken on the same plurality of measuring tools over the same predetermined period of time are also recorded. Generally, the calibration substrates are cleaned a plurality of times over the same predetermined period of time. Based on differences identified between measurements taken from product and calibration substrates in view of the number of times the calibration substrates have been cleaned, one may establish a cleaning limit for calibration substrates to ensure that there is good correlation between measurements taken from calibration and product substrates.

While the foregoing cleaning limit may be established for any metrology tool and cleaning combination, it is desirable to maximize usage of calibration substrates by employing a cleaning process in which UV light at a wavelength of between approximately 185 nm and 254 nm is directed to the surface of the calibration substrate at a power sufficient to remove substantially all molecular airborne contaminants from the surface of the calibration substrate without raising the temperature of the substrate above approximately 50° C.

BRIEF DESCRIPTION OF THE DRAWINGS

Non-limiting and non-exhaustive examples are described with reference to the following Figures.

DETAILED DESCRIPTION

Figure 1:
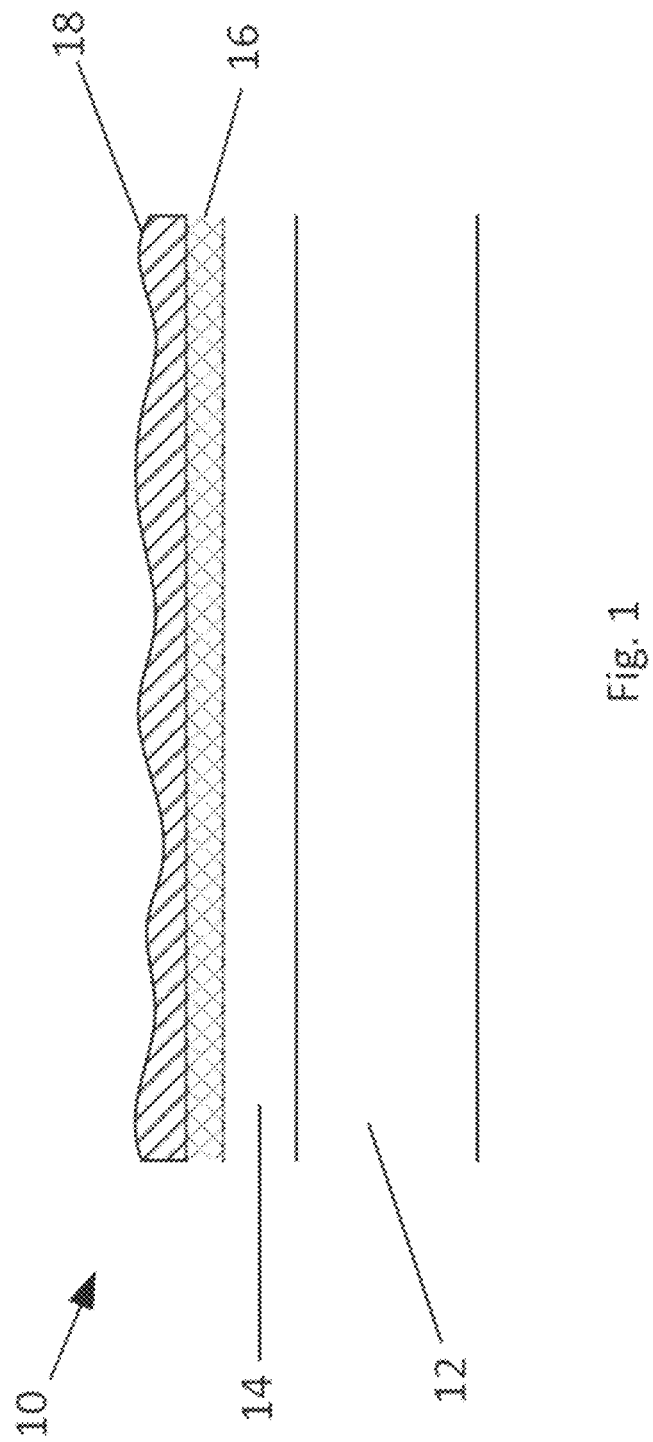
FIG. 1 illustrates a schematic cross section of a typical calibration substrate having an oxide layer and a molecular airborne contaminant layer formed thereon.

In the following detailed description of the present technology, reference is made to the accompanying drawings that form a part hereof, and in which is shown, by way of illustration, specific embodiments and examples in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Specifically, in the interests of brevity, this description will discuss a single type of calibration substrate that is used to verify measurements of a specific type of product substrate as an example for a broader range of different product types, process environments, and substrates. The following detailed description is, therefore, not to be taken in a limiting sense, and the scope of the present invention is defined only by the appended claims and equivalents thereof.

Figure 2:
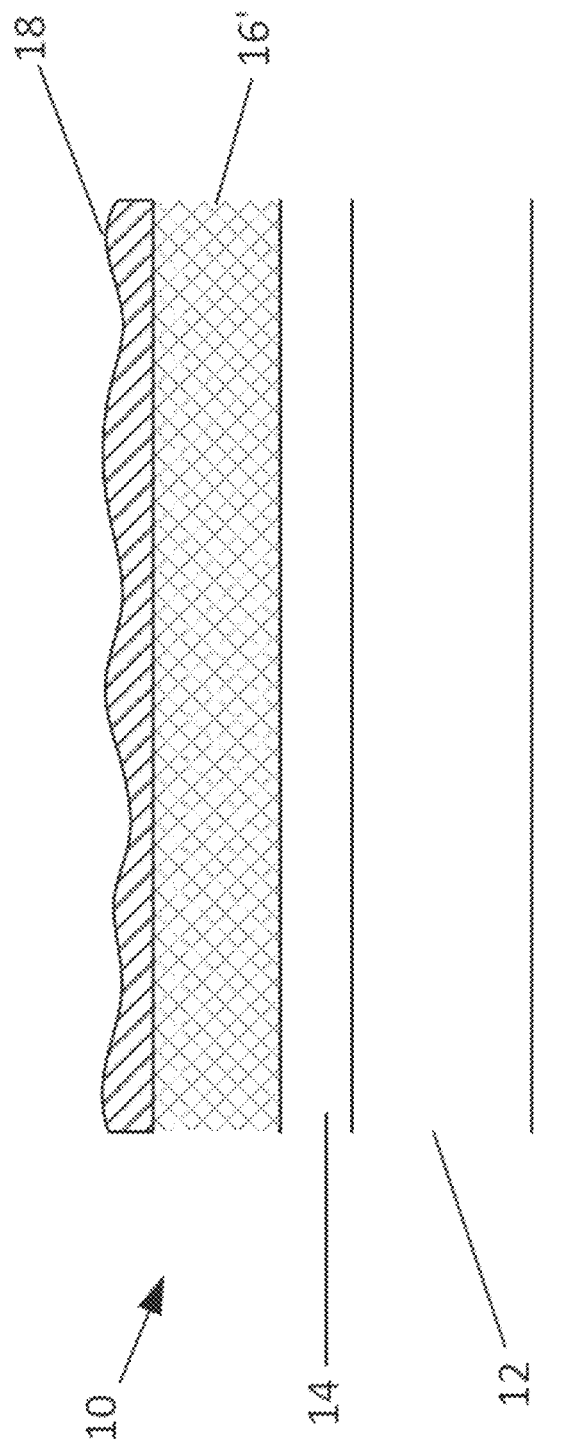
FIG. 2 illustrates the calibration substrate of FIG. 1 having an improperly thick oxide layer formed thereon.

Calibration wafers such as that shown in FIGS. 1 and 2 are intended to represent the structures that are to be formed on a product wafer (not shown). The structures formed on a calibration wafer are not typically identical to those formed on a product wafer but, by design, there is intended to be good correlation between the measured features of calibration and product substrates. The manufacturer in this instance may then rely upon measurements taken from calibration substrates as signifying that measurements taken from a product wafer will be of a similar quality. Where one receives what is considered to be a "good" measurement from a measuring tool addressed to a calibration wafer, then one can reasonably presume that a measurement taken from a product wafer with the same measuring tool will be similarly acceptable.

FIG. 1 depicts a schematic cross section of a typical calibration substrate 10 having an oxide layer 16 and a molecular airborne contaminant layer 18 formed thereon. The calibration substrate 10 shown in FIG. 1 includes a silicon body 12 on which may optionally be deposited various structures, layers, or materials common to the semiconductor field, as indicated by optional layer 14. The body of the substrate 10 may be made of other materials known to those skilled in the art as necessary for the particular implementation. An oxide layer may also be formed on the optional portion 14 of the substrate 10. In other examples, the oxide layer 16 may be formed directly on the body 12 of the substrate. As will be familiar to those skilled in the art, molecular airborne contaminants (MACs) will come to rest on the otherwise clean surface of the oxide layer 16, as indicated by the MAC layer 18. This MAC layer 18 is undesirable as it is not intended to form a part of a semiconductor device and is observable to many measuring tools commonly used in semiconductor fabrication processes, such as ellipsometers for measuring thin film thicknesses among others. Because MACs are observable to measuring tools, the MACs can negatively affect calibration measurements taken from calibration substrates 10. The presence of a MAC layer 18 reduces the correlation between the calibration and product substrates.

Calibration substrates 10 differ from product substrates in that they are continually used for extended period of times and as a result, they are subject to higher levels of MAC contamination and other processes that can modify, change or even damage the calibration substrates. Product substrates are typically passed through a fabrication process with a minimum of exposure to the ambient environment, contaminants, or extraneous processes that are not directly tied to completing the structure of the IC devices contained therein. Because calibration wafers are subject to a higher degree of contamination, they are typically cleaned fairly frequently, either programmatically or when an anomalous measurement is obtained from the calibration or product substrate. As such, any adverse effects caused from cleaning may be compounded with each cleaning.

FIG. 2 illustrates one example of what may occur as a result of frequent cleanings of calibration substrates. As can be seen, the post-cleaning oxide layer 16' deposited on the calibration substrate 10 is much thicker than that shown in FIG. 1. As will be appreciated by those skilled in the art, repeated high temperature cleaning processes elevate the temperature of the calibration substrate 10 and increase the diffusion of ambient air, and particularly the oxygen in ambient air, to the surface of the silicon base 12. At these elevated temperatures, the formation rate of the oxide layer is increased for a period of time. Over time and with repetition of the cleaning process, the post-cleaning oxide layer 16' on the silicon base 12 will grow to a point where it no longer accurately corresponds, for example, to an oxide layer formed on a product substrate. Because a calibration that takes place in a range that is generally the same as the range of measurements that are to be used on product wafers is both desirable and advantageous, a calibration substrate 10 with an over-thick post-cleaning oxide layer 16' may be discarded in favor of a new calibration substrate 10 with a more compliant oxide layer 16 thickness. It is therefore desirable to minimize variation to calibration substrates 10 due to phenomena such as increased oxide growth resulting from high temperature cleaning cycles.

Figure 3:
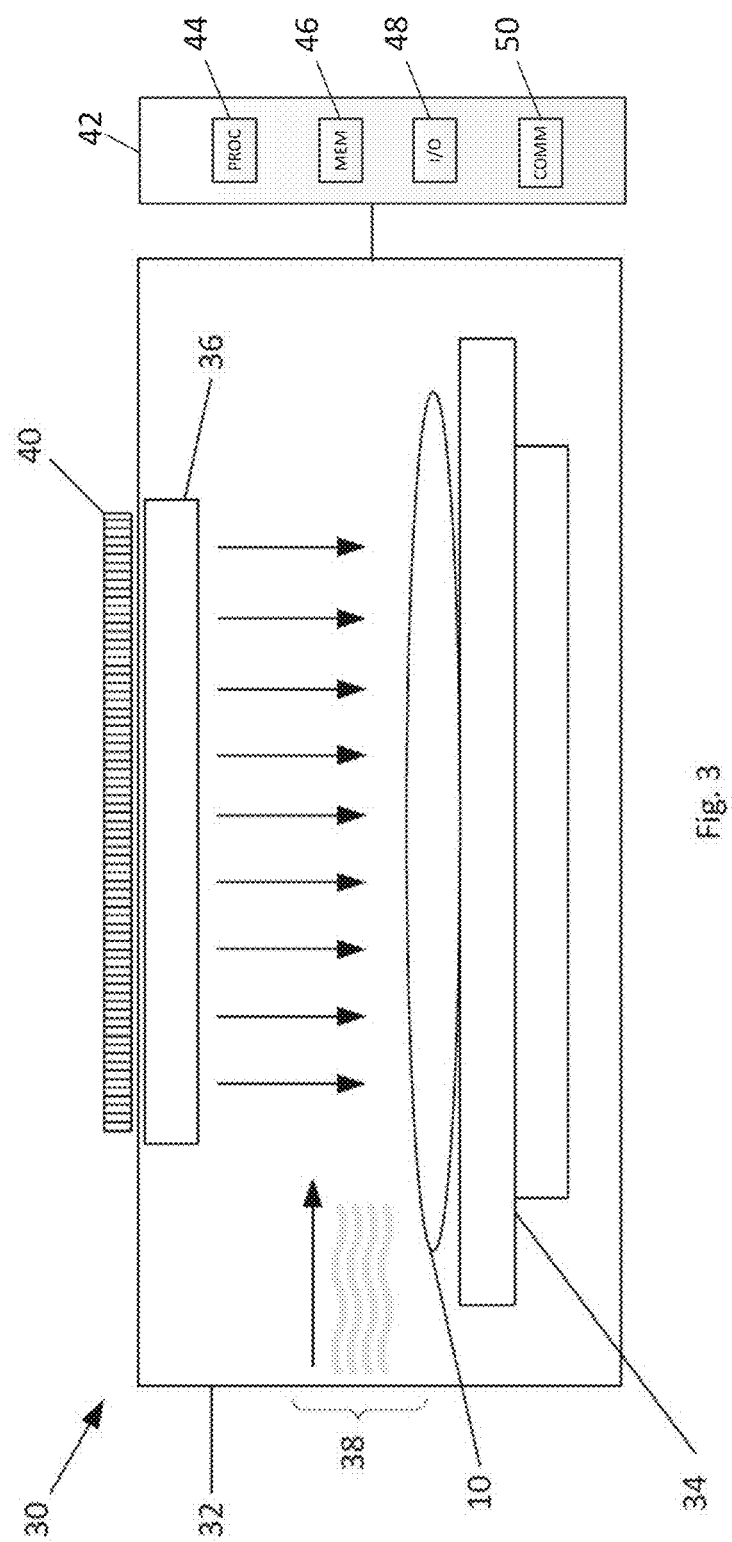
FIG. 3 illustrates a schematic representation of a system for cleaning a calibration substrate.

FIG. 3 illustrates schematically one example of a cleaning system 30 according to the present cleaning technology. An enclosure 32 includes a substrate support 34 and a source 36 of electromagnetic radiation 36, such as UV light. The support 34 may be a top plate or chuck of any suitable arrangement or may be comprised of a set of lift pins (not shown) that limit direct contact with reverse side of the calibration substrate 10. The support 34 may be provided with vacuum clamping mechanisms of a known type to ensure that the calibration substrate 10 does not move during exposure. In some examples, a supply 38 of cooling gases is provided, but the supply of cooling gases is not necessary. The calibration substrate 10 is placed on the substrate support 34 by known means, i.e. by a robot or similar substrate handler and the MAC layer 18 is removed by the action induced by UV radiation incident on the MAC layer 18. UV radiation from the source 36 is incident upon oxygen molecules in the gases present in the enclosure 32 or in the MAC layer 18 itself, which converts some portion of the oxygen to ozone. Additional UV radiation converts some portion of the ozone into oxygen and monatomic oxygen (O), which is highly reactive with the type of hydrocarbons that typically form the MAC layer 18. Reactions between the monatomic oxygen and the MAC layer 18 remove and or release from the substrate the materials that form the layer 18. In some examples, the by-products of this reaction are removed by the flow of cooling gases from the supply 38. Note that in some examples the cooling gas is filtered ambient air and, in other examples, the cooling gas is a gas that does not react readily with organic materials, such as nitrogen or a suitable noble gas.

As one example, short wavelength UV light in the range of about 184-254 nm is sufficient to generate ozone and monatomic oxygen as described above. The source 36 may therefore be selected to output light in at least the wavelength range of about 184-254 nm. One suitable source is a mercury vapor lamp. The dose of UV light necessary to desorb substantially the entire MAC layer 18 is variable and depends on the nature and thickness of the MAC layer 18. In one embodiment, it is sufficient to expose a calibration substrate 10 to the UV source 36 for approximately 50 seconds. This exposure, depending on the nature of the MAC layer 18, is sufficient to remove a MAC layer 18 of approximately 3-5 angstroms in thickness. Note that if successive measurements remain anomalous, repeated exposures of the calibration substrate 10 to the UV source 36 are typically sufficient to fully desorb the MAC layer 18. This additional treatment is useful to eliminate a MAC layer 18 as a cause of an anomalous measurement.

In examples where a mercury vapor lamp is used as a UV source 36, it may be useful to preheat the lamp to vaporize the mercury in the lamp to ensure that full radiant power is obtained from the source 36 during exposure of the calibration substrate 10. Where other UV light sources such as light-emitting diodes (LEDs), lasers, or arc lamps are used, pre-heating may not be useful or necessary. The length of exposure of a calibration substrate 10 is at least partially inversely proportional to the power output by the source 36. That is, the higher the power of the source 36, the shorter the exposure time that is needed to clean the surface of the calibration substrate 10. In the example illustrated in FIG. 3, a heater 40 is positioned adjacent to the source 36. In one example, a resistive heater is applied to wall of the enclosure 32 to warm the source 36 in examples where the source is a lamp. Inclusion of the heater has an incidental effect of heating the ambient air temperature of the interior of the enclosure 32. In some examples, the ambient air temperate in the interior of the enclosure may raise to approximately 80° C. Where a source 36 outputs a large amount of heat, radiant or conductive, it may be useful to provide a cooler (not shown) in lieu of a heater, depending on the requirements of the particular application.

During exposure of a calibration substrate 10 to UV light emitted from the source 36, the temperature of the calibration substrate 10 is also raised from its base temperature, which is usually around 20°-25° C. (i.e., ambient temperatures). In some examples, the temperature of the calibration substrate 10 is raised to a temperature between about 40°-50° C. Some of this temperature rise is due to the elevated temperature in the enclosure 32. By keeping the substrate at low temperatures, such as within the range of 40°-50° C., the undesirable formation of oxides discussed above is reduced or prevented. The reduction of oxide formation is due in part to the lowness of the temperature because diffusion of oxygen to the base 12 of the calibration substrate 10 is limited at lower temperatures. Another factor contributing to the prevention of oxide formation is that calibration substrate 10 returns to ambient temperatures from its maximum temperature of between 40°-50° C. in a short period of time after exposure to the UV light. In short, any increase in diffusion is very modest and occurs over a very short period of time. As a result, cleaning of calibration substrate 10 using this technique does not modify the calibration substrate 10 in any meaningful way and more cleaning cycles can be undertaken.

The cleaning system 30 may also include a controller 42 for controlling the processes and methods associated with the cleaning system 30, as described herein. This is only one example of a suitable controller 42 and is not intended to suggest any limitation as to the scope of use or functionality. Other well-known computing systems, environments, and/or configurations that may be suitable for use as a controller and include, but are not limited to, personal computers, server computers, hand-held or laptop devices, multiprocessor systems, microprocessor-based systems, programmable consumer electronics such as smartphones, network PCs, minicomputers, mainframe computers, distributed computing environments that include any of the above systems or devices, and the like.

In on example configuration, controller 42 typically includes at least one processing unit 44 and memory 46. Depending on the exact configuration and type of controller 42, memory 46 (storing, among other things, instructions for performing methods and processes as described herein) may be volatile (such as RAM), non-volatile (such as ROM, flash memory, etc.), or some combination of the two. Memory 1704 may store computer-executable instructions that may be executed by the processing unit 44 to perform the methods disclosed herein. Further, the memory may be incorporated into one or more computer-readable storage devices including, but not limited to, solid-state, magnetic, or optical disks. The storage device should be understood to be a tangible device. In addition, the controller 42 may also have input device and output devices 48, such as keyboard, mouse, pen, voice input, etc. and a display, speakers, printer, etc. Also included in the environment may be one or more communication connections 50 such as LAN, WAN, point to point, etc.

The controller 42 may be a single computer operating in a networked environment using logical connections to one or more remote computers. The remote computer may be a personal computer, a server, a router, a network PC, a peer device or other common network node, and typically includes many or all of the elements described above as well as others not so mentioned. The logical connections may include any method supported by available communications media. The controller 42 may be connected physically or wirelessly to the metrology tools and the components of the cleaning system 30 in order to control the actions of the metrology tools and cleaning components.

In practice, process engineers tasked with overseeing the production of IC devices monitor measurements of product substrates using selected metrology tools. Where an anomalous measurement is obtained there are generally two logical outcomes. First, the product substrate may be discrepant. Second, the metrology tool may be in error. Depending on the quality criteria set for the production of a particular IC device, a single anomalous measurement may be sufficient to require a calibration procedure for the metrology tool, though in other instances, a discrepant trend in measurements over time may be investigated. In either case, a calibration substrate 10 will be measured in lieu of a product substrate to determine whether the metrology tool is operating within specifications. To avoid an anomalous calibration measurement, one may clean the calibration wafer prior to its measurement using the methods described herein-above. Where an anomalous calibration measurement is obtained, one may attempt to clean the calibration wafer a second or even a third time to ensure the removal of any MAC layers 18 that may induce measurement error. After a sufficient number of cleanings (one or more), an anomalous calibration reading may be confirmed and maintenance or adjustment of the metrology tool may be undertaken.

Figure 4:
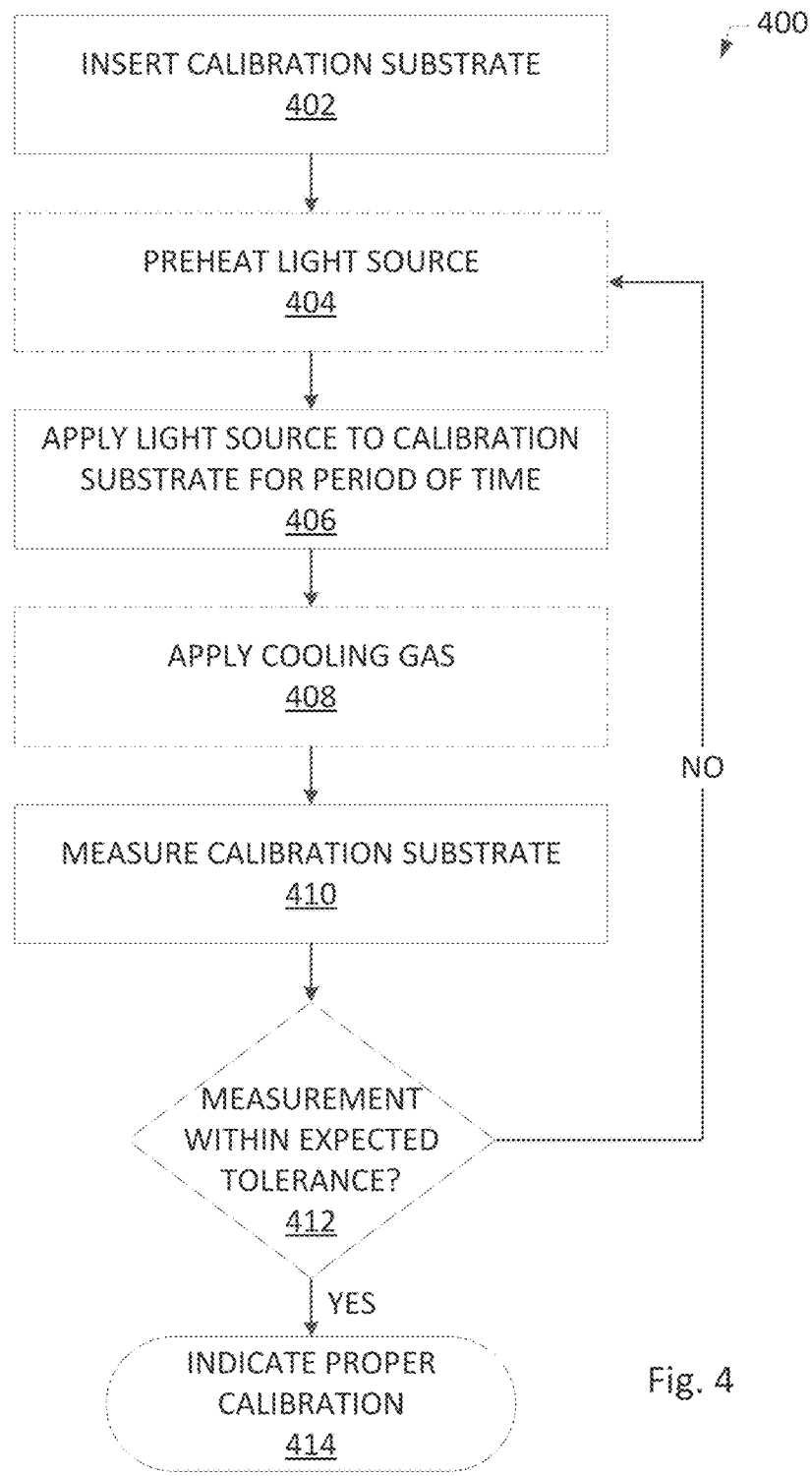
FIG. 4 illustrates an example method for cleaning a calibration substrate.

FIG. 4 illustrates an example method 400 for cleaning a calibration substrate. While the methodology is shown and described as being a series of acts that are performed in a sequence, it is to be understood and appreciated that the methodology is not limited by the order of the sequence. For example, some acts can occur in a different order than what is described herein, as will be appreciated by those skilled in the art. In addition, some acts can occur concurrently with another act. Further, in some instances, not all acts may be required to implement a methodology described herein. Moreover, the acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodology can be stored in a computer-readable medium, displayed on a display device, and/or the like.

At operation 402, the calibration substrate is inserted into a cleaning system, such as cleaning system 30 discussed above. In examples where the light source is a lamp that benefits from preheating, the lamp may be preheated at operation 404. At operation 406, the light source is applied to the calibration substrate for a period of time suitable for the particular calibration substrate. As discussed above, the light applied to the calibration substrate is generally within the UV range. The time period for which the light is applied may be predetermined through the use of experimental data or through empirical or theoretical analysis based on the composition of the calibration substrate, the wavelength of light applied, and the intensity of the light. In some examples, the light may be applied in a pulsed manner to prevent overheating the calibration substrate. In other examples, the temperature of the calibration substrate is monitored, and the exposure of the calibration substrate to the light is terminated when the temperature reaches a certain threshold. For instance, the exposure to the light may be terminated when the temperature monitoring indicates the calibration substrate may rise to temperature above 50° C. At operation 408, a cooling gas may be applied such that the flow of the cooling gas removes by-products of the reaction caused by the exposure of light emitted from the light source.

At operation 410, the calibration substrate is measured by the metrology tools. Based on the measurement of the calibration substrate, it is determined if the measurements are within the expected tolerances for the calibration substrate at operation 412. If the measurements are not within the expected tolerances, the measurement may still be an anomalous calibration measurement due to MACs on the calibration substrate. Such an anomalous calibration measurement may be identified as a discrepant datum. As such, the method flows back to operation 404, where the cleaning process of the calibration substrate is performed again. If anomalous calibration measurements continue to be obtained at operation 412, the cleaning process may be repeated for a predetermined number of times before a determination is made that the metrology tools need to be recalibrated. If however, the measurements made at operation 410 are determined to be within the expected tolerances, an indication is presented that the metrology tools are properly calibrated at operation 414.

Figure 5:
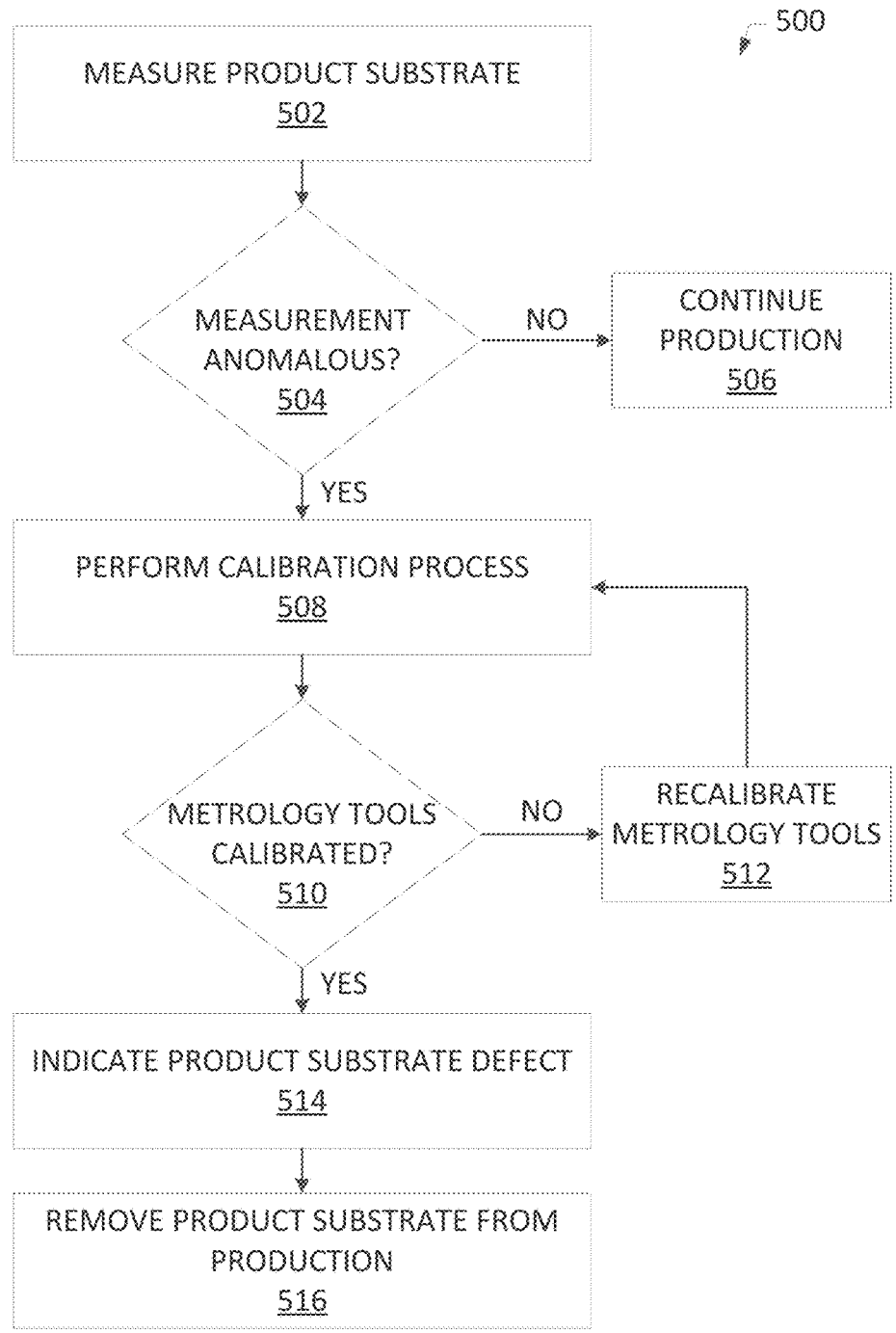
FIG. 5 illustrates an example method for production controls incorporating a calibration process.

FIG. 5 illustrates an example method 500 for production controls incorporating a calibration process. At operation 502, a product substrate is measured using measuring tools, such as metrology tools. At operation 504, those measurements are analyzed to determine if there is an anomaly in the product substrate. Such an anomaly may be identified as a discrepant datum. If the measurements indicate that the product substrate is not anomalous, production continues at operation 506 and the next product substrate is analyzed. If, however, the measurements indicate that the product substrate is anomalous, a calibration process is performed at operation 508. The calibration process may be calibration and cleaning method 400 described above with reference to FIG. 4. At operation 510, based on the calibration process performed at operation 508, it is determined whether the metrology tools used to analyze the product substrate are properly calibrated. If the metrology tools are not properly calibrated, the metrology tools are recalibrated at operation 512, and the calibration process is performed again to ensure that the metrology tools have been properly recalibrated. If, however, the metrology tools are determined to be properly calibrated at operation 510, an indication is generated that indicates the product substrate has a defect at operation 514. In some examples, the product substrate is removed from production at operation 516. The product substrate may be removed from production for further analysis to determine whether the entire substrate should be discarded, or if a portion of the substrate can be recovered.

Based on a plurality of recorded measurements of calibration substrates and product substrates, a limit on the number of cleanings may be established. While the cleaning processes described herein have a minimal effect of the cleaning substrate, there may be minimal adverse effects that compound over time. As such, it may be useful to establish a preferred limit of cleanings for each calibration substrate.

While various examples were provided above, the present invention is not limited to the specifics of the examples. The calibration substrate cleaning arrangements described herein may be used alone or in conjunction with other metrology or processing tools or equipment. Furthermore, the cleaning arrangements described herein may be used with items other than calibration substrates. Because the measurements of the calibration substrate and the product substrates should be substantially the same, a difference criterion or limit may be established to indicate when the calibration substrate is no longer an accurate correlation substrate for the product substrate, despite being substantially free of MACs. For instance, if the measurements of the calibration substrates and the product substrates are no longer within a 1% tolerance despite recent cleaning of the calibration substrate, the difference criterion will have been determined to be exceeded. At that point, the number of cleanings performed on the particular calibration substrate may be determined, and that number of cleanings may be established to be the limit of cleanings for calibration substrates.

Although specific embodiments of the present invention have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. For instance, those having skill in the art will appreciate that while the cleaning techniques described herein are primarily discussed with reference to cleaning a calibration substrate, the cleaning techniques may also be used to clean a product substrate. Accordingly, this application is intended to cover any adaptations or variations of the invention. It is manifestly intended that this invention be limited only by the following claims and equivalents thereof.

What is claimed is:

1. A method for treatment of calibration substrates used in a calibration process, the method comprising:
    recording a plurality of measurements of at least one characteristic of a first calibration substrate measured by one or more measuring tools over a predetermined period of time;
    recording a plurality of measurements of the at least one characteristic of product substrates measured by the one or more measuring tools over the predetermined period of time;
    directing ultraviolet light, a plurality of times during the predetermined period of time, to a surface of the first calibration substrate while maintaining the temperature of the first calibration substrate below a predetermined temperature threshold, thereby removing contaminants from the surface of the first calibration substrate;
    establishing a cleaning limit for calibration substrates based on the recorded measurements of the first calibration substrate and the product substrates where a difference criterion between the calibration substrate and product substrate measurements has been exceeded, wherein the cleaning limit is a number of cleanings; and
    directing ultraviolet light to the surface of a second calibration substrate until the cleaning limit is reached;
    upon reaching the cleaning limit, removing the second calibration substrate from the calibration process.

2. The method of claim 1, wherein the ultraviolet light has wavelength between the range of approximately 185 nm and 254 nm.

3. The method of claim 1, wherein the predetermined temperature threshold is approximately 50° C.

4. The method of claim 1, further comprising applying a cooling gas to the first calibration substrate while directing ultraviolet light to the surface of the first calibration substrate.

5. The method of claim 1, further comprising:
    monitoring a temperature of the first calibration substrate while directing ultraviolet light to the surface; and
    terminating the ultraviolet light if the temperature of the first calibration substrate reaches the predetermined temperature threshold.

6. The method of claim 1, wherein the contaminants are part of a molecular airborne contaminant layer.

7. The method of claim 6, wherein the molecular airborne contaminant layer is formed on an oxide layer of the first calibration substrate.

8. The method of claim 6, wherein the molecular airborne contaminant layer is about 3-5 angstroms thick.

9. The method of claim 1, wherein the ultraviolet light is produced by a mercury vapor lamp.

10. The method of claim 1, wherein the ultraviolet light is directed to the first calibration substrate for less than 50 seconds for each of the plurality of times.

11. A method for treatment of calibration substrates used in a calibration process, the method comprising:
    recording a plurality of measurements, of at least one characteristic, of a first calibration substrate measured by one or more measuring tools over a period of time;
    recording a plurality of measurements, of the at least one characteristic, of product substrates measured by the one or more measuring tools over the period of time;
    directing electromagnetic radiation to a surface of the first calibration substrate while maintaining the temperature of the first calibration substrate below a predetermined temperature threshold, thereby removing contaminants from the surface of the first calibration substrate;
    based on differences between the measured at least one characteristic of the first calibration substrate and the measured at least one characteristic of the product substrates, establishing a cleaning limit for calibration substrates, wherein the cleaning limit is a number of cleanings;
    directing electromagnetic radiation to the surface of a second calibration substrate until the cleaning limit is reached; and
    upon reaching the cleaning limit, removing the second calibration substrate from the calibration process.

* * * * *